(12) United States Patent
Chen et al.

(10) Patent No.: US 8,860,300 B2
(45) Date of Patent: *Oct. 14, 2014

(54) COLOR-TEMPERATURE-TUNABLE DEVICE

(71) Applicant: Everlight Electronics Co., Ltd., New Taipei (TW)

(72) Inventors: Yen Wen Chen, New Taipei (TW); Shih Chen Shi, New Taipei (TW); Hsi-Chuan Hsu, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/928,481

(22) Filed: Jun. 27, 2013

(65) Prior Publication Data

US 2013/0285562 A1 Oct. 31, 2013

Related U.S. Application Data

(63) Continuation of application No. 13/472,379, filed on May 15, 2012, now Pat. No. 8,497,629, which is a continuation of application No. 12/847,387, filed on Jul. 30, 2010, now Pat. No. 8,198,803.

(51) Int. Cl.
| | |
|---|---|
| *H05B 33/00* | (2006.01) |
| *H05B 33/08* | (2006.01) |
| *G09G 3/34* | (2006.01) |
| *H01L 25/075* | (2006.01) |
| *H01L 33/50* | (2010.01) |

(52) U.S. Cl.
CPC ........ *H05B 33/0857* (2013.01); *G09G 2320/06* (2013.01); *G09G 3/3406* (2013.01); *H01L 33/50* (2013.01); *H01L 25/0753* (2013.01)

USPC ........ 313/504; 313/112; 313/503; 315/169.3; 345/76; 257/89

(58) Field of Classification Search
None
See application file for complete search history.

(56) References Cited

U.S. PATENT DOCUMENTS

| | | | |
|---|---|---|---|
| 7,906,041 | B2 | 3/2011 | Li et al. |
| 8,125,137 | B2 | 2/2012 | Medendorp, Jr. et al. |
| 8,198,803 | B2 * | 6/2012 | Chen et al. ............ 313/504 |
| 8,497,629 | B2 * | 7/2013 | Chen et al. ............ 313/504 |
| 2007/0018558 | A1 | 1/2007 | Chua et al. |
| 2007/0159064 | A1 | 7/2007 | Choi et al. |
| 2009/0309485 | A1 | 12/2009 | Tamaki et al. |
| 2010/0025700 | A1 | 2/2010 | Jung et al. |

(Continued)

FOREIGN PATENT DOCUMENTS

| | | |
|---|---|---|
| CN | 2388710 | 7/2000 |
| CN | 1610137 | 4/2005 |
| CN | 1744316 | 3/2006 |
| TW | 200923272 | 6/2009 |

*Primary Examiner* — Ashok Patel
(74) *Attorney, Agent, or Firm* — Han IP Corporation

(57) ABSTRACT

A method of operating a color-temperature-tunable device is described. The method drives a first light emitting diode (LED) chip with a first driving current from a first power source. The first LED chip is configured to emit a first light having a first peak wavelength. The method also drives a second LED chip with a second driving current from a second power source. The second LED chip is configured to emit a second light having a second peak wavelength. The method further maintains a total driving current, which includes the first driving current and the second driving current, approximately constant. The second peak wavelength is different from the first peak wavelength.

13 Claims, 12 Drawing Sheets

(56) References Cited

U.S. PATENT DOCUMENTS

2010/0237766 A1 9/2010 Baumgartner et al.
2010/0244731 A1* 9/2010 Kaihotsu et al. ............... 315/294
2010/0277401 A1* 11/2010 Takahara et al. ................ 345/76

\* cited by examiner

COLOR-TEMPERATURE-TUNABLE DEVICE

CROSS-REFERENCE TO RELATED APPLICATIONS

This application is a continuation of U.S. patent application Ser. No. 13/472,379, filed May 15, 2012, which is a continuation of U.S. patent application Ser. No. 12/847,387, filed Jul. 30, 2010 and issued as U.S. Pat. No. 8,198,803 on Jun. 12, 2012, which are herein incorporated by reference in their entirety.

TECHNICAL FIELD

The present invention relates to a color-temperature-tunable device, and particularly to a color-temperature-tunable device comprising light emitting diode chips.

BACKGROUND

Due to their long lifetime, small size, high resistance to shock and vibration, low heat generation, and low power consumption, light emitting diodes (LEDs) have been widely used in displays or as light sources in various consumer electronic devices, electrical appliances, and apparatuses. Recently, multi-color and high brightness LEDs have also been used in, for example, outdoor, large-screen displays and traffic lights. In the future, LEDs may act as the major illumination light source, with the advantages of energy savings and as environmental protection.

One advantage of using LEDs as a lighting source is that it can be designed to generate white light with variable correlated color temperature (or simply color temperature, "CCT"). One conventional color-temperature-tunable device is a white LED comprising a blue LED chip and a yellow LED chip, emitting blue light and yellow light, respectively, when driven by driving currents. To change the color temperature of such a device, one can change the ratio of the driving currents for the blue and yellow LED chips to change the ratio of the intensities of the blue and yellow lights. However, since the luminous efficiency of blue LED chips and yellow LED chips is different, changing driving currents to change the ratio of blue and yellow lights may result in wasted power. The brightness of the device also can change dramatically. Moreover, in such a device, lights having different wavelengths (i.e., lights having different colors, such as blue light and yellow light) are emitted from two LED chips spatially arranged apart from each other, and the resultant white light may not be spatially uniform, especially when viewed from a position close to the white LED. Therefore, additional components may be needed to minimize such spatial non-uniformity, so as to realize more uniformly white light.

A widely accepted approach to realize white LEDs is to use the combination of a blue LED chip and a yellow phosphor. The yellow phosphor will absorb a portion of the blue light emitted by the blue LED chip, and in turn emit yellow light. Unabsorbed blue light mixes with the yellow light to generate a white light. One approach to realize color temperature tuning in such a white LED is to add a red or yellow LED chip. By changing the ratio of the driving currents for the blue LED chip and the red or yellow LED chip, the color temperature of the resultant white light can be changed. However, the resultant white light may also not be spatially uniform since the blue LED chip and the yellow LED chip are spatially arranged apart from each other, and thus additional components may be needed to correct this non-uniformity.

Therefore, there is a need for a color-temperature-tunable device, which emits a more uniform white light having different color temperatures and operable in a more power-efficient way.

SUMMARY

In the following description, certain aspects and embodiments will become evident. It should be understood that the aspects and embodiments, in their broadest sense, could be practiced without having one or more features of these aspects or embodiments. Thus, it should be understood that these aspects and embodiments are merely exemplary and not restrictive.

In one aspect, a color-temperature-tunable device may include a first LED chip and a second LED chip. The first LED chip may be configured to emit a first light having a first peak wavelength. The first LED chip may be driven by a first driving current from a first power source. The second LED chip may be configured to emit a second light having a second peak wavelength. The second LED chip may be driven by a second driving current from a second power source. The second peak wavelength may be different from the first peak wavelength. A total driving current comprising the first driving current and the second driving current may be maintained approximately constant while the first driving current and the second driving current are different from one another.

In one embodiment, the first LED chip and the second LED chip may be gallium nitride based LED chips made of gallium nitride based materials.

In one embodiment, the first peak wavelength may be within a range from approximately 450 nm to approximately 500 nm, and the second peak wavelength may be within a range from approximately 370 nm to approximately 440 nm.

In one embodiment, the first peak wavelength may be within a range from approximately 450 nm to approximately 470 nm, and the second peak wavelength may be within a range from approximately 400 nm to approximately 440 nm.

In one embodiment, the first LED chip may include a first blue LED chip, and the second LED chip may include a second blue LED chip.

In one embodiment, the color-temperature-tunable may further include at least one more first blue LED chip and at least one more second blue LED chip. The at least one more first blue LED chip may be configured to emit light having the first peak wavelength. The at least one more first blue LED chip may be driven by the first driving current. The at least one more second blue LED chip may be configured to emit light having the second peak wavelength. The at least one more second blue LED chip may be driven by the second driving current.

In one embodiment, color-temperature-tunable device may further include a wavelength converting layer above at least a portion of the first LED chip and at least a portion of the second LED chip.

In one embodiment, the wavelength converting layer may include a phosphor material, and the phosphor material may be capable of emitting a yellow light under the excitation of a light having a wavelength shorter than the yellow light emitted by the phosphor material.

In one embodiment, the wavelength converting layer may include a phosphor material, and the phosphor material may have different excitation efficiencies at the first wavelength and the second wavelength.

In one embodiment, the wavelength converting layer may include a phosphor material, and the phosphor material may include YAG:$Ce^{3+}$.

In one embodiment, the wavelength converting layer may include a single layer.

In one embodiment, the wavelength converting layer may include a plurality of layers, with each of the plurality of layers above at least a portion of the first LED chip and at least a portion of the second LED chip.

In another aspect, a method of operating a color-temperature-tunable device may drive a first light emitting diode (LED) chip with a first driving current from a first power source, the first LED chip configured to emit a first light having a first peak wavelength. The method may also drive a second LED chip a second driving current from second power source, the second LED chip configured to emit a second light having a second peak wavelength. The method may further maintain a total driving current comprising the first driving current and the second driving current approximately constant. The second peak wavelength may be different from the first peak wavelength.

In one embodiment, the first driving current and the second driving current may be different from one another.

In one embodiment, the method may provide a wavelength converting layer above at least a portion of the first LED chip and at least a portion of the second LED chip.

In one embodiment, the wavelength converting layer may include a phosphor material that is capable of emitting a yellow light under the excitation of a light having a wavelength shorter than the yellow light emitted by the phosphor material.

In one embodiment, the wavelength converting layer may include a phosphor material, and the phosphor material may have different excitation efficiencies at the first peak wavelength and the second peak wavelength.

In one embodiment, the wavelength converting layer may include a phosphor material, and the phosphor material may include YAG:$Ce^{3+}$.

In one embodiment, the wavelength converting layer may include a single layer.

In one embodiment, the wavelength converting layer may include a plurality of layers. Each of the plurality of layers may be above at least a portion of the first LED chip and at least a portion of the second LED chip.

In one embodiment, the first peak wavelength may be within a range from approximately 450 nm to approximately 500 nm, and the second peak wavelength may be within a range from approximately 370 nm to approximately 440 nm.

In one embodiment, the first peak wavelength may be within a range from approximately 450 nm to approximately 470 nm, and the second peak wavelength may be within a range from approximately 400 nm to approximately 440 nm.

In one embodiment, the first LED chip and the second LED chip may be gallium nitride based LED chips made of gallium nitride based materials.

In one embodiment, the first LED chip may include a first blue LED chip, and the second LED chip may include a second blue LED chip.

In one embodiment, driving a first LED chip may include driving multiple first blue LED chips that are configured to emit light having the first peak wavelength, the multiple first blue LED chips being driven by the first driving current. Moreover, driving a second LED chip may include driving multiple second blue LED chips that are configured to emit light having the second peak wavelength, the multiple second blue LED chips being driven by the second driving current.

In yet another aspect, a method of producing white lights having different color temperatures may increase a first driving current for a first LED chip group comprising at least one first blue LED chip that emits a first light having a first peak wavelength. The method may also decrease a second driving current for a second LED chip group comprising at least one second blue LED chip that emits a second light having a second peak wavelength. The second peak wavelength may be different from the first peak wavelength.

In one embodiment, the method may further maintain a total driving current comprising the first driving current and the second driving current approximately constant.

In one embodiment, the first peak wavelength may be within a range from approximately 450 nm to approximately 500 nm, and the second peak wavelength may be within a range from approximately 370 nm to approximately 440 nm.

In one embodiment, the first peak wavelength may be within a range from approximately 450 nm to approximately 470 nm, and the second peak wavelength may be within a range from approximately 400 nm to approximately 440 nm.

In one embodiment, the first LED chip group and the second LED chip group may comprise gallium nitride based LED chips made of gallium nitride based materials.

In a further aspect, a method of producing white lights having different color temperatures may drive at least one first LED chip and at least one second LED chip with a total driving current so that the at least one first LED chip emits a first light having a first peak wavelength and the at least one second LED chip emits a second light having a second peak wavelength different from the first peak wavelength. The method may also change a ratio between a first portion of the total current that drives the at least one first LED chip and a second portion of the total current that drives the at least one second LED chip.

In one embodiment, the first peak wavelength may be within a range from approximately 450 nm to approximately 500 nm, and the second peak wavelength may be within a range from approximately 370 nm to approximately 440 nm.

In one embodiment, the first peak wavelength may be within a range from approximately 450 nm to approximately 470 nm, and the second peak wavelength may be within a range from approximately 400 nm to approximately 440 nm.

In one embodiment, the at least one first LED chip and the at least one second LED chip may comprise gallium nitride based LED chips made of gallium nitride based materials.

Features and advantages consistent with the invention will be set forth in part in the description which follows, and in part will be obvious from the description, or may be learned by practice of the invention. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DETAILED DESCRIPTION

Embodiments consistent with the invention include color-temperature-tunable devices that can emit a more uniform light with tunable color temperature than the prior art. The color temperature of the light emitted by such devices can be changed without significantly changing the input power. The intensity, and thus the brightness, of the output light can be kept relatively stable when the color temperature is changed.

Hereinafter, embodiments consistent with the present invention will be described with reference to the drawings. Wherever possible, the same reference numbers will be used throughout the drawings to refer to the same or like parts.

Figure 1:
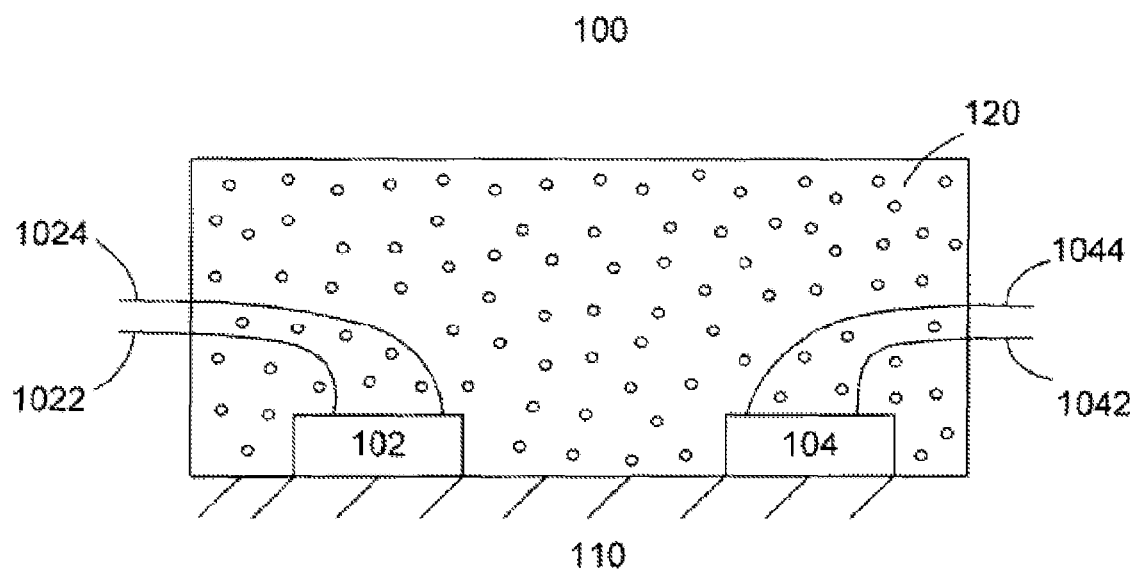
FIG. 1 is a cross-sectional view schematically showing a color-temperature-tunable device consistent with one embodiment of the present invention.
Figure 2:
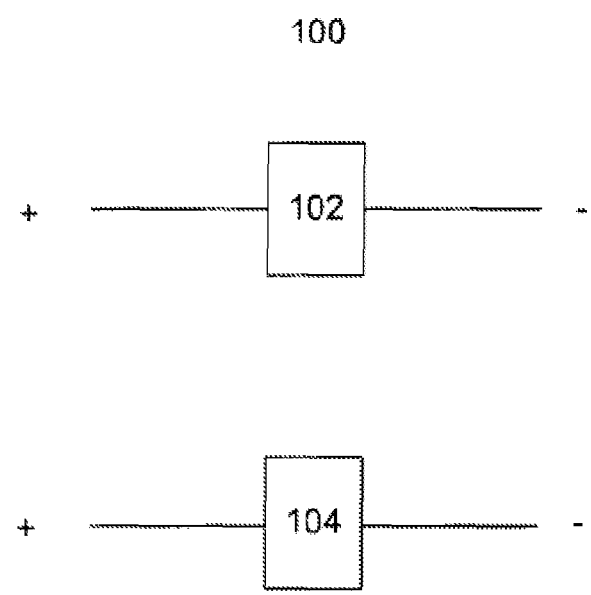
FIG. 2 schematically shows the color-temperature-tunable device of FIG. 1.

FIG. 1 is a cross-sectional view schematically showing an embodiment of a color-temperature-tunable device 100 consistent with the present invention. Color-temperature-tunable device 100 may comprise a first light emitting diode ("LED") chip 102 and a second LED chip 104 mounted on a substrate 110. Wires 1022 and 1024 connect first LED chip 102 to a first power source (not shown), and wires 1042 and 1044 connect second LED chip 104 to a second power source. First and second power sources provide a first driving current for first LED chip 102 and a second driving current for the second LED 104. First LED chip 102 and second LED chip 104 may emit light when driven by the driving currents. FIG. 2 schematically depicts color-temperature-tunable device 100 in another view, showing that first LED chip 102 and second LED chip 104 may be separately driven by two power sources.

Consistent with the present invention, since first LED chip 102 and second LED chip 104 may be driven by the first and second power sources, respectively, the driving currents flowing through first LED chip 102 and second LED chip 104 may be different, and thus the intensities of the output light from first LED chip 102 and second LED chip 104 may be controlled independently.

First LED chip 102 and second LED chip 104 may be, for example, gallium nitride based LED chips capable of emitting light of different wavelength, such as blue lights. In some embodiments, first LED chip 102 may emit a light having a peak wavelength in the range of about 450 nm to about 500 nm and second LED chip 104 may emit a light having a peak wavelength in the range of about 370 nm to about 440 nm. In some embodiments, first LED chip 102 may emit a light having a peak wavelength in the range of about 450 nm to about 470 nm. In some embodiments, second LED chip 104 may emit a light having a peak wavelength in the range of about 400 nm to about 440 nm.

Color-temperature-tunable device 100 may also comprise a wavelength converting layer 120 over all or a portion of LED chips 102 and 104. In some embodiments, wavelength converting layer 120 may comprise a resin and a phosphor material distributed in the resin. The phosphor may absorb a portion of the light emitted by first LED chip 102 and/or second LED chip 104 and in turn emit a light having a different wavelength. In some embodiments, the phosphor may be YAG:Ce$^{3+}$, which, under the excitation of a blue light emitted by first LED chip 102 or second LED chip 104, may emit a light of yellow color. Unabsorbed blue light combined with the yellow light emitted by the phosphor may result in a light that appears to the human eyes to be white.

In some embodiments, wavelength converting layer 120 may be a thin layer with a flat upper surface. In some embodiments, wavelength converting layer 120 may be a thin layer having a shape conformal with the LED chips. In some embodiments, wavelength converting layer 120 may have a convex or a concave upper surface. In some embodiments, wavelength converting layer 120 may comprise a plurality of vertically stacked layers, at least one of which comprises resin and phosphor material distributed therein and at least another one of which only comprises resin without phosphor material. Those skilled in the art, having read this disclosure, would appreciate that other layer shapes may be implemented.

Figure 3:
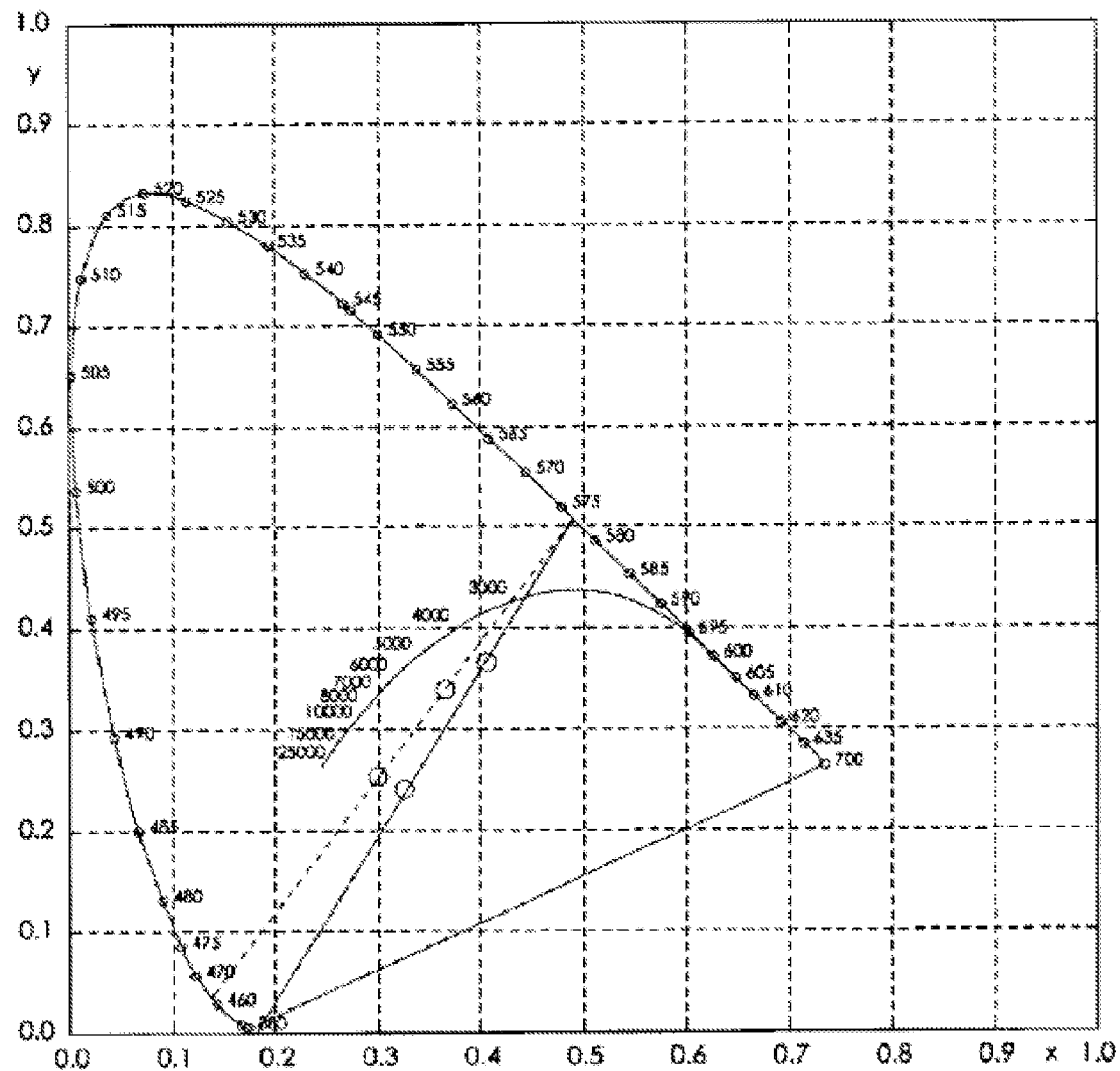
FIG. 3 shows a color space and the change of the position of a resultant light in the color space that can be realized by changing driving currents for a device comprising only one LED chip (dashed or solid line) and for a device consistent with embodiments of the present invention (the area defined by the four circles).

In a white LED comprising one LED chip and a wavelength converting layer, changing the driving current for the LED chip may to some extent change the color temperature of the resultant white light. Therefore, such a white LED may also be tuned to emit white light having different color temperatures. Referring to FIG. 3, the dashed line shows the change of the resultant white light in the color space by changing the driving current for a device having only an LED chip corresponding to first LED chip 102 below a wavelength converting layer. The solid line shows a change of the resultant white light in the color space by changing the driving current for a device having only an LED chip corresponding to second LED chip 104 below a wavelength converting layer. As the driving current varies, the brightness of the white light emitted by such devices may vary significantly. A color-temperature-tunable device consistent with embodiments of the present invention may avoid this problem, as explained in more detail below.

Figure 4:
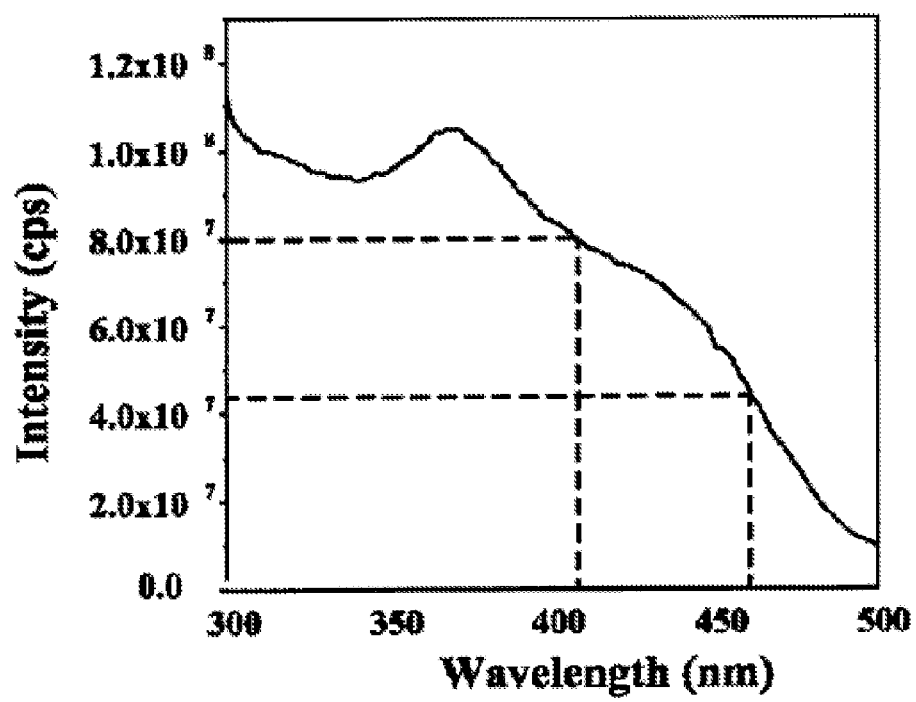
FIG. 4 shows the intensities of light emitted by a phosphor when being excited by excitation lights having different wavelengths.

In color-temperature-tunable device 100, although first LED chip 102 and second LED chip 104 may be beneath all or some of the same wavelength converting layer 120, the excitation efficiency of the phosphor material in wavelength converting layer 120 may be different at different excitation wavelengths. That is, under the excitation of light having different wavelengths, even if the intensity of the excitation light is the same, the intensity of the light emitted by the phosphor may be different, as shown in FIG. 4.

As noted above, in some embodiments, first LED chip 102 may emit a blue light having a peak wavelength in the range from about 450 nm to about 470 nm and second LED chip 104 may emit a blue light having another peak wavelength in the range from about 400 nm to about 440 nm. Therefore, it may be seen from FIG. 4 that the light emitted by LED chip 104 may more efficiently excite the phosphor in wavelength converting layer 120 than the light emitted by LED chip 102 does. By changing the ratio of the driving currents for first LED chip 102 and second LED chip 104, the ratio of the intensity of the yellow light emitted by the phosphor and the intensity of the total blue light emitted by first LED chip 102 and second LED chip 104 may be changed, resulting in white lights with different color temperatures. For example, by increasing the driving current for first LED chip 102 and decreasing the driving current for second LED chip 104, the intensity of the yellow light emitted by the phosphor may be decreased, so that the color temperature of the resultant white light may be increased. On the other hand, by decreasing the driving current for first LED chip 102 and increasing the driving current for second LED chip 104, the intensity of the yellow light emitted by the phosphor may be increased, so that the color temperature of the resultant white light may be decreased.

As can be seen from the above examples, changing the ratio of the driving currents for the two LED chips may be realized by increasing the driving current for one LED chip and decreasing the driving current for the other LED chip. Therefore, the total driving current, and thus the total input power, of the entire color-temperature-tunable device 100 may be kept approximately constant.

As described above, for a device having only one LED chip, the color temperature can only be changed along a line in the color space, such as the dashed or the solid line shown in FIG. 3. By employing at least two different LED chips driven by different power sources, the color temperature of a color-temperature-tunable device consistent with the present invention may be changed within an area in the color space, such as the area defined by the four circles shown in FIG. 3. This provides more freedom for changing the color temperature. At the same time, the total driving current and thus the total input power of the color-temperature-tunable device consistent with the present invention can be kept approximately constant. The brightness of the resultant white light also may not change significantly. Therefore, power wasting can be reduced.

Moreover, the peak wavelength of second LED chip 104 is in the range of about 400 nm to about 440 nm. Human eyes are not sensitive to light having a wavelength in such a range. Therefore, although first LED chip 102 and second LED chip 104 of color-temperature-tunable device 100 may be spatially separated from each other, it may appear to an observer that blue light is only from first LED chip 102, and thus the problem of non-uniform light distribution may be avoided.

In the above described embodiment, a color-temperature-tunable device consistent with the present invention comprises two LED chips separately controlled by changing the driving currents for the two LED chips individually. In other embodiments consistent with the present invention, a color-temperature-tunable device may comprise a plurality of groups of LED chips, each of the groups comprising at least one LED chip. In some embodiments, among these plurality of groups of LED chips, at least one LED chip in at least one of the plurality of groups of LED chips is different from other LED chips. For example, at least one LED chip in at least one of the plurality of groups of LED chips is different from other LED chips within that group. For another example, the LED chips within at least one of the plurality of groups of LED chips are identical to each other but are different from LED chips in other groups.

Figure 5:
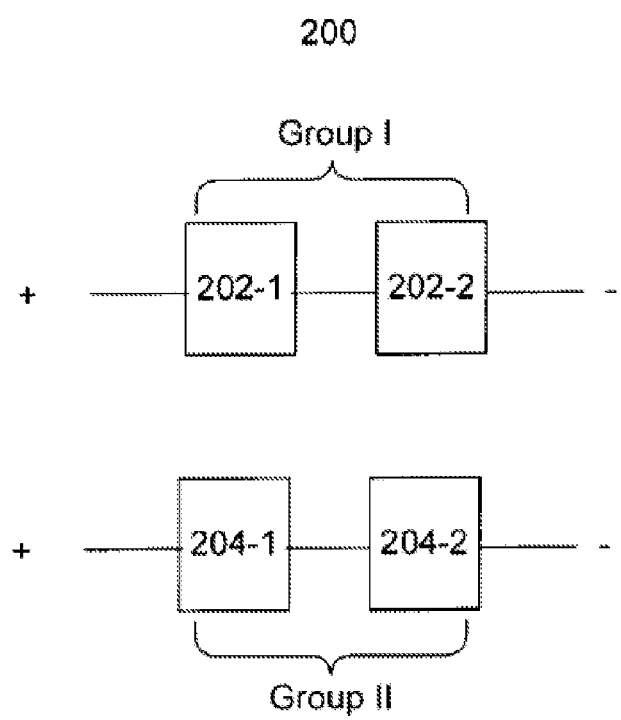
FIG. 5 schematically shows a color-temperature-tunable device consistent with another embodiment of the present invention.
Figure 6A:
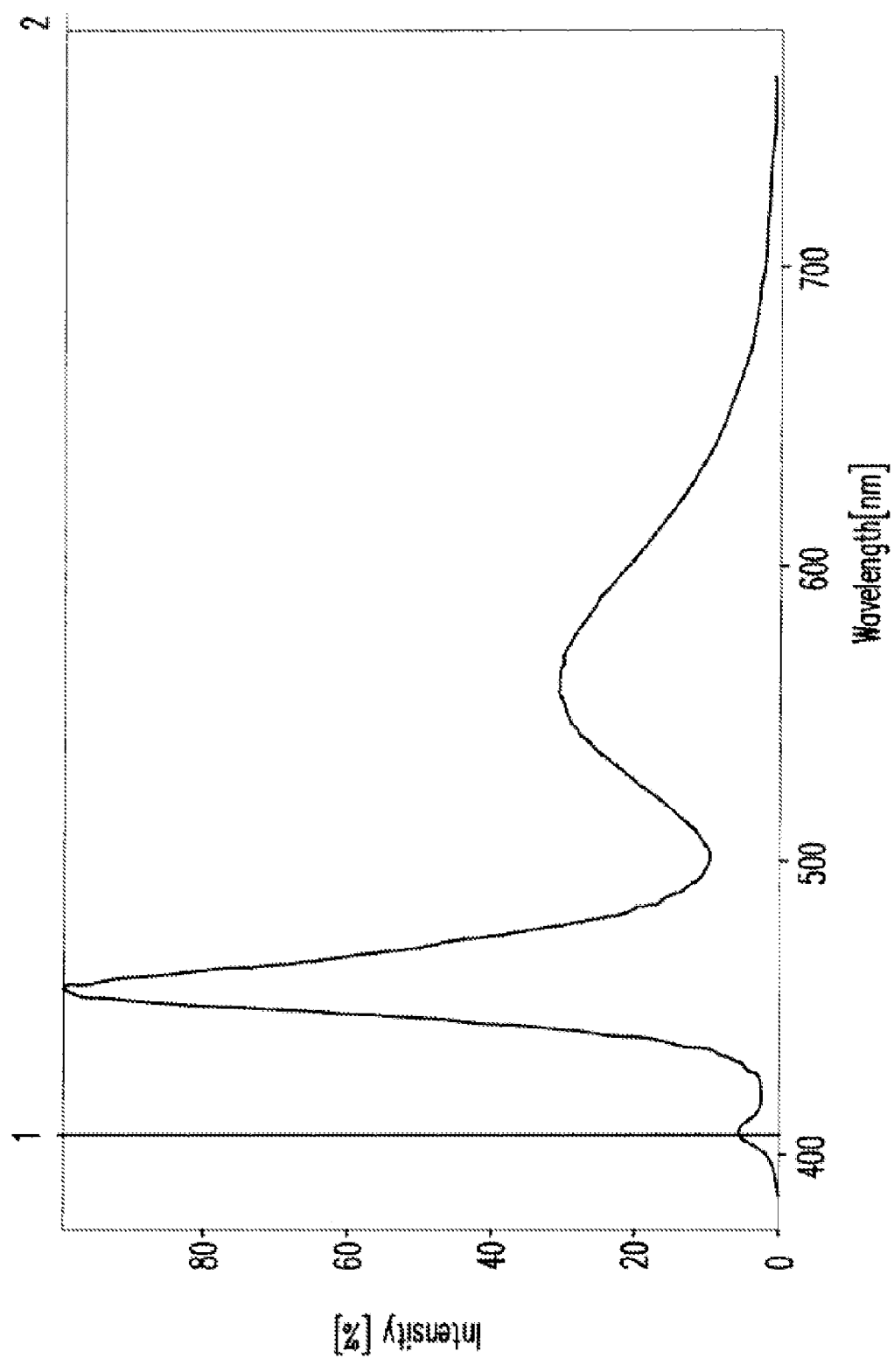
FIGS. 6A and 6B show the emitting spectrum of the color-temperature-tunable device of FIG. 5 driven under one combination of driving currents and the position of the resultant white light in the CIE-1931 color space.
Figure 6B:
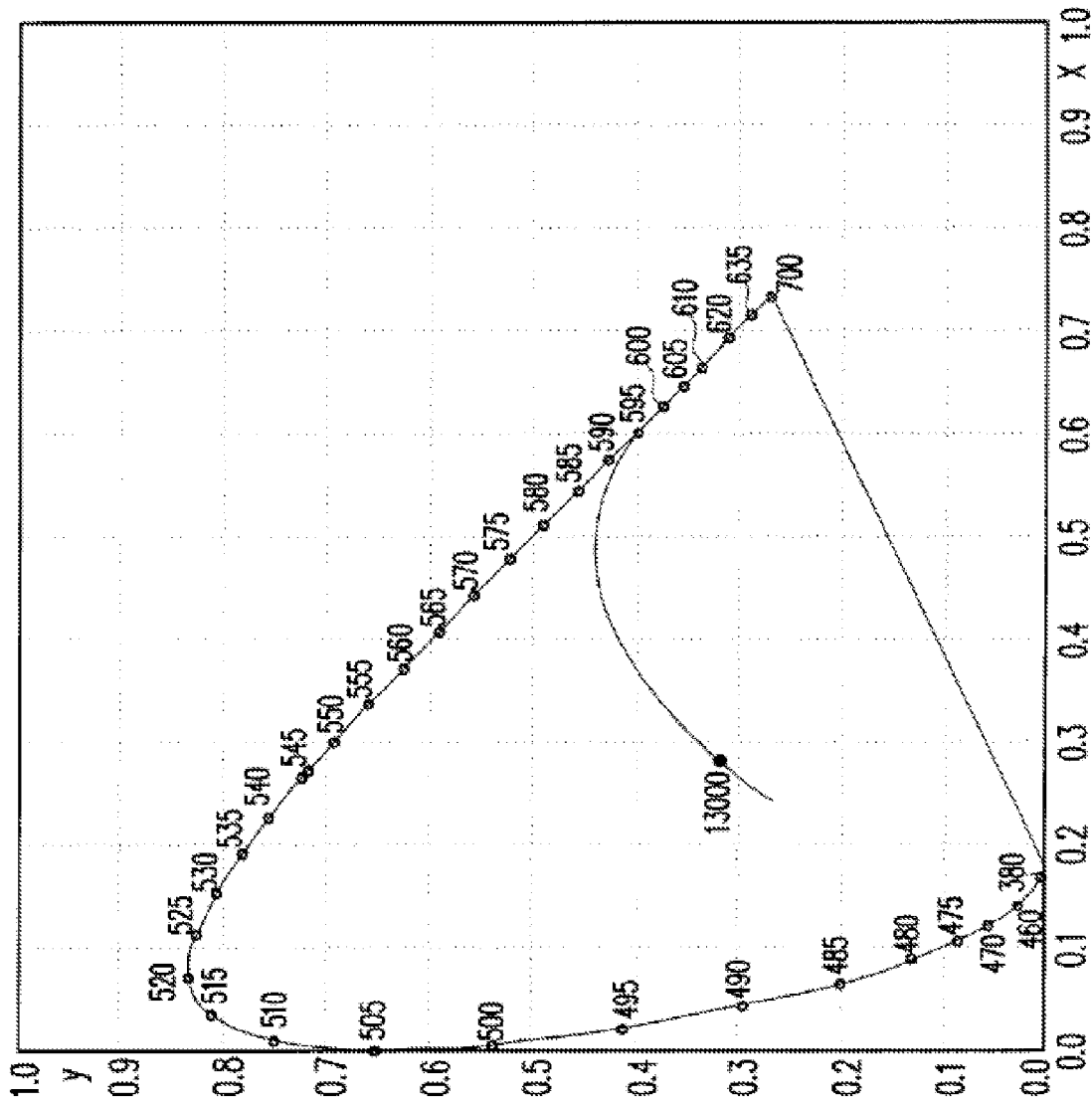
Figure 7A:
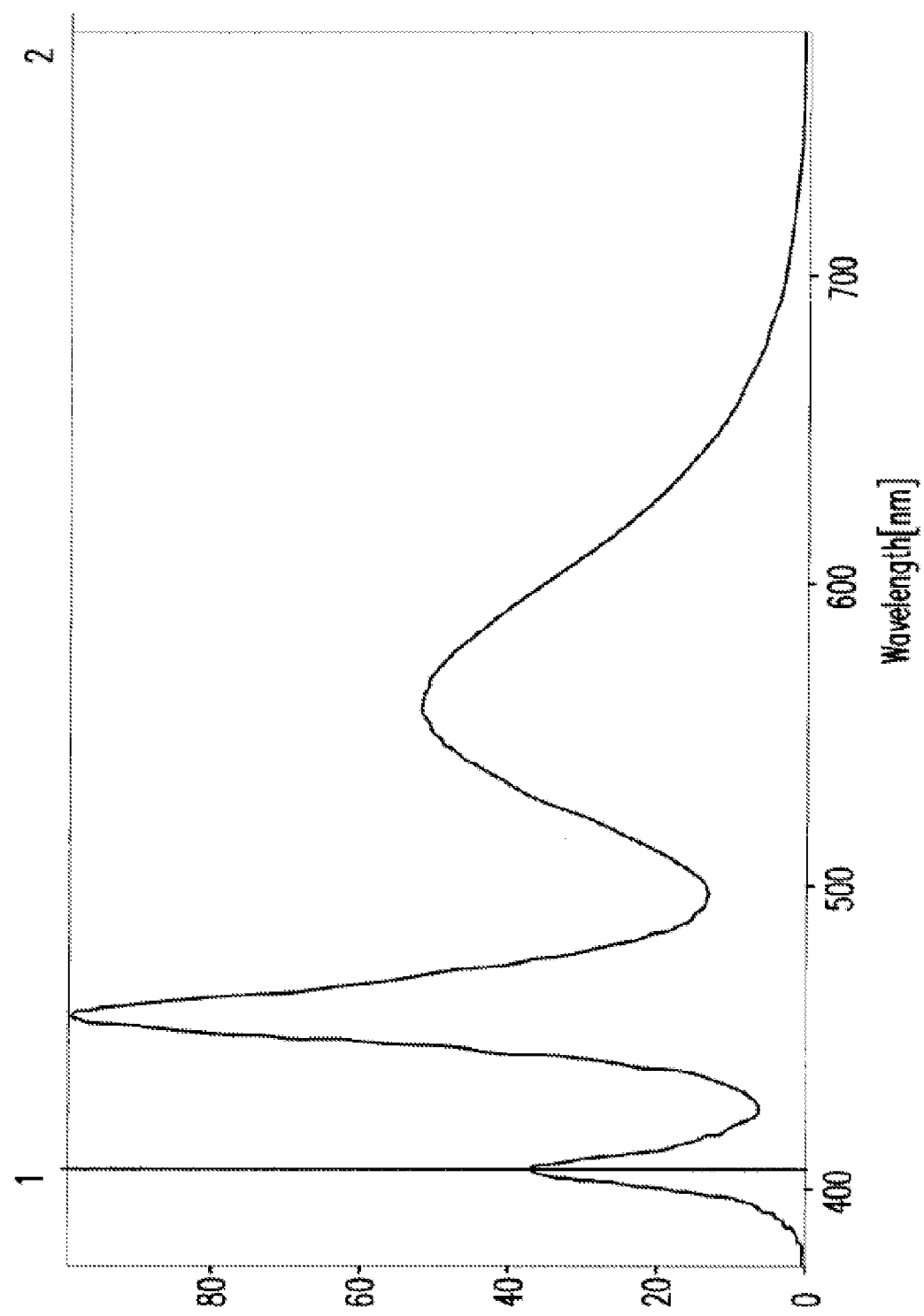
FIGS. 7A and 7B show the emitting spectrum of the color-temperature-tunable device of FIG. 5 driven under another combination of driving currents and the position of the resultant white light in the CIE-1931 color space.
Figure 7B:
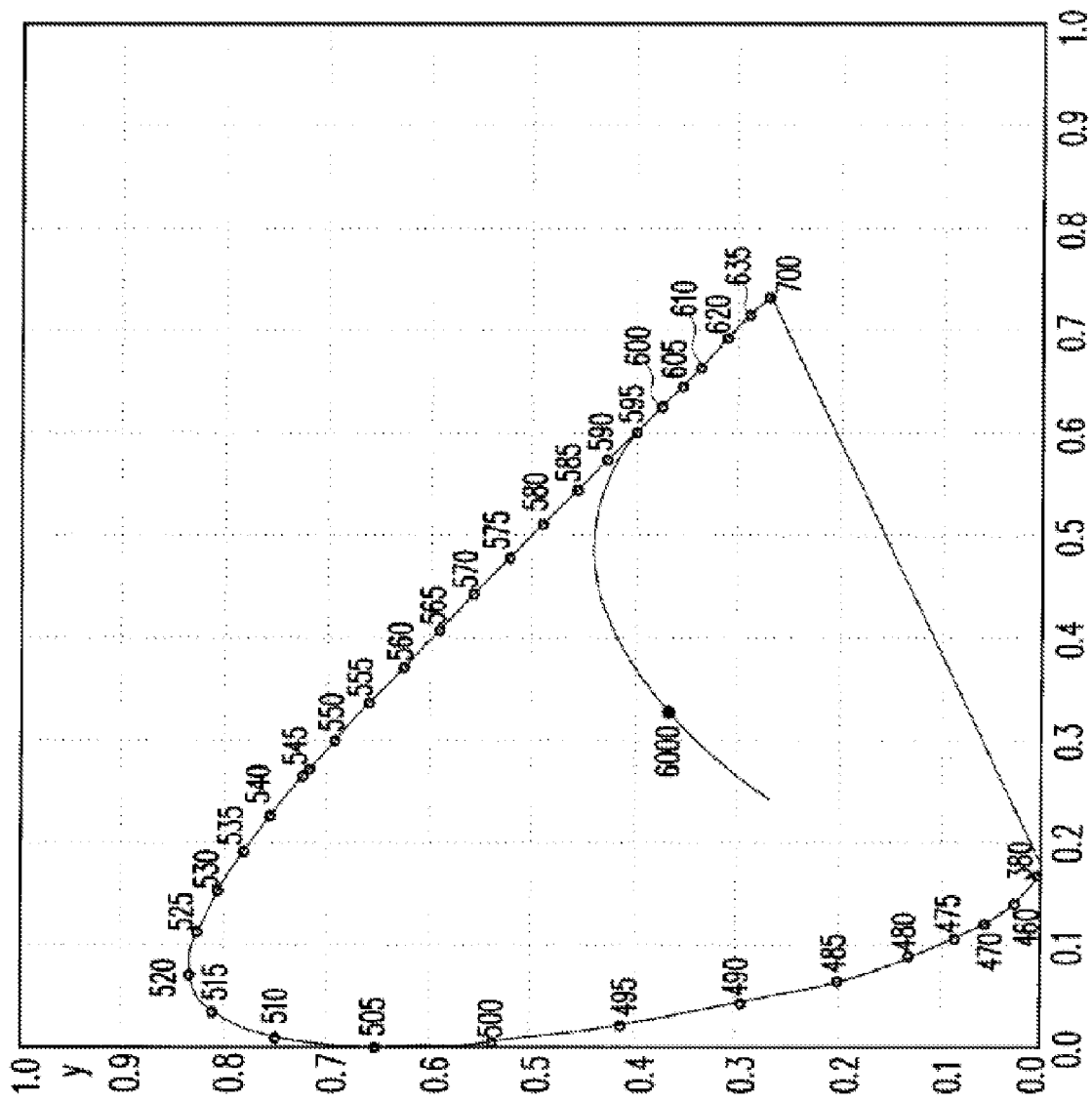
Figure 8A:
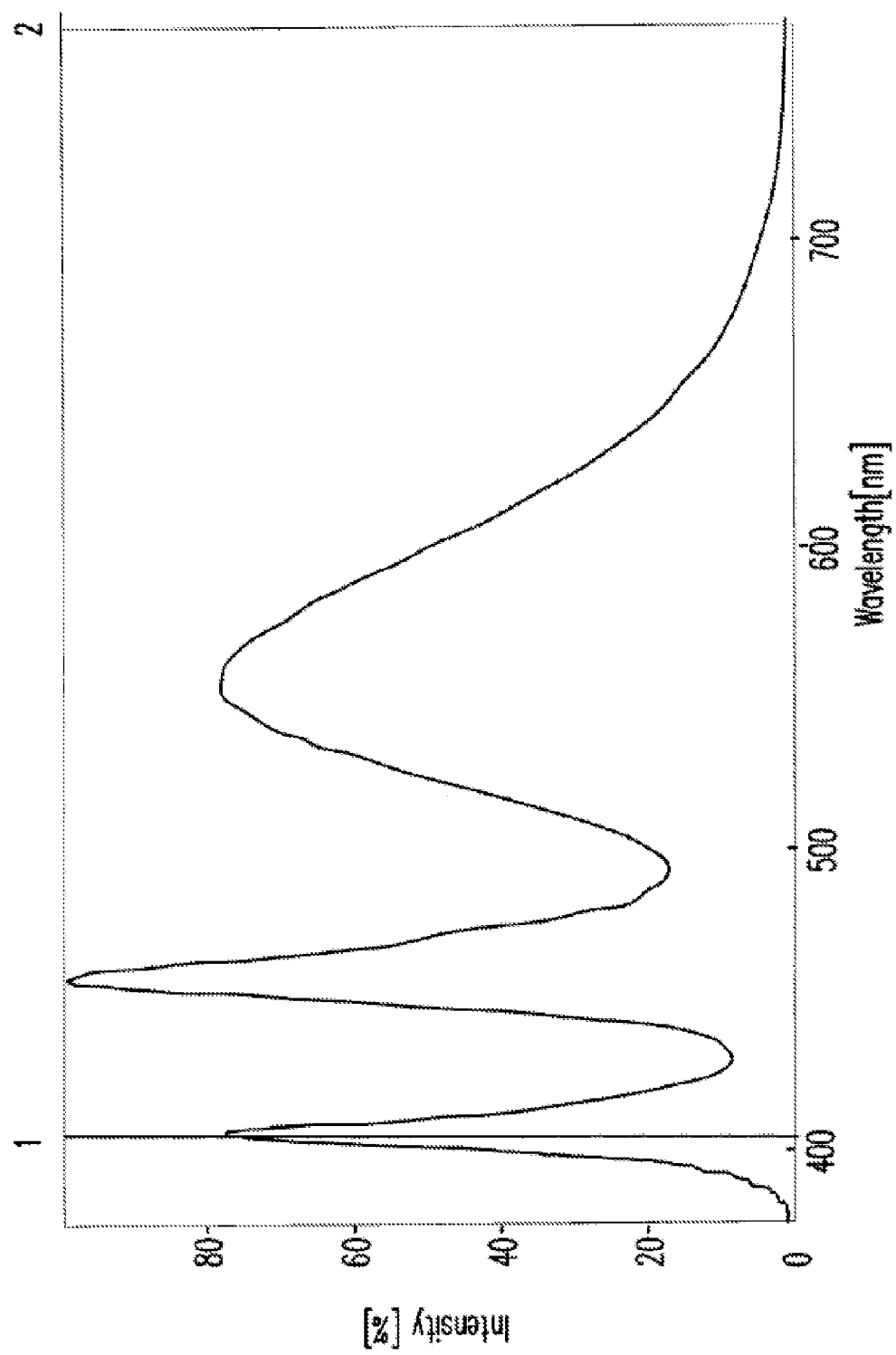
FIGS. 8A and 8B show the emitting spectrum of the color-temperature-tunable device of FIG. 5 driven under yet another combination of driving currents and the position of the resultant white light in the CIE-1931 color space.
Figure 8B:
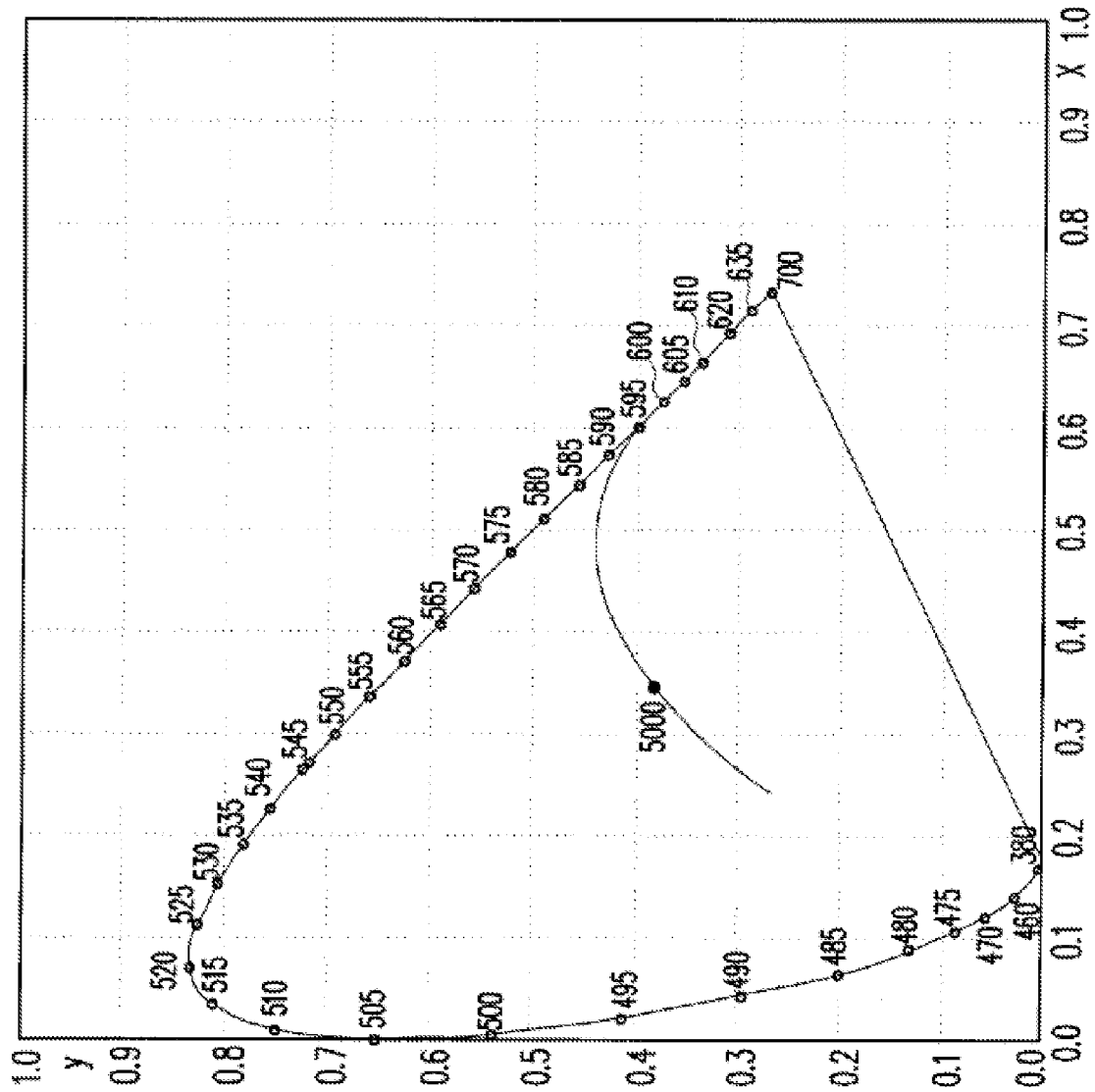
Figure 9A:
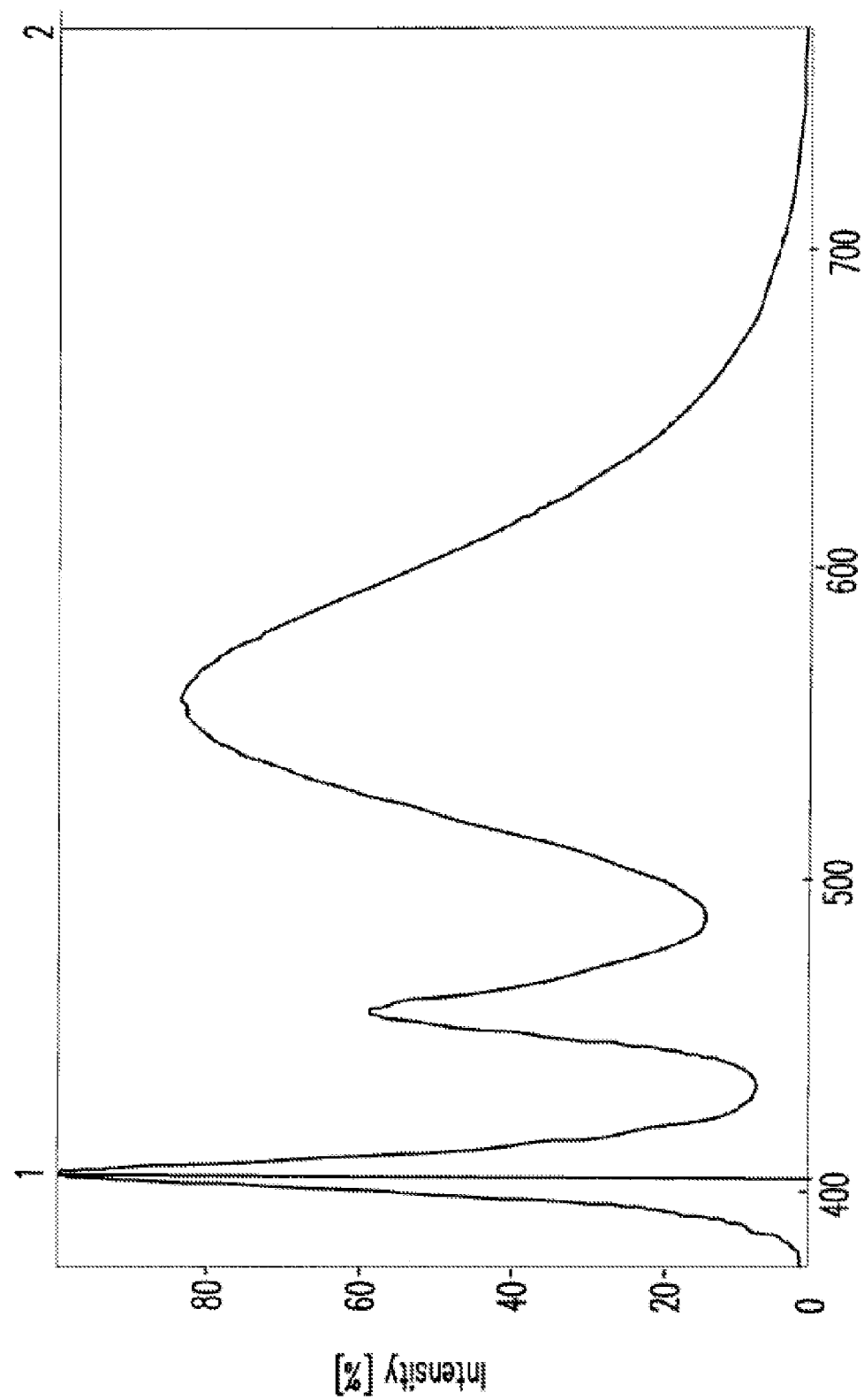
FIGS. 9A and 9B show the emitting spectrum of the color-temperature-tunable device of FIG. 5 driven under still another combination of driving currents and the position of the resultant white light in the CIE-1931 color space.
Figure 9B:
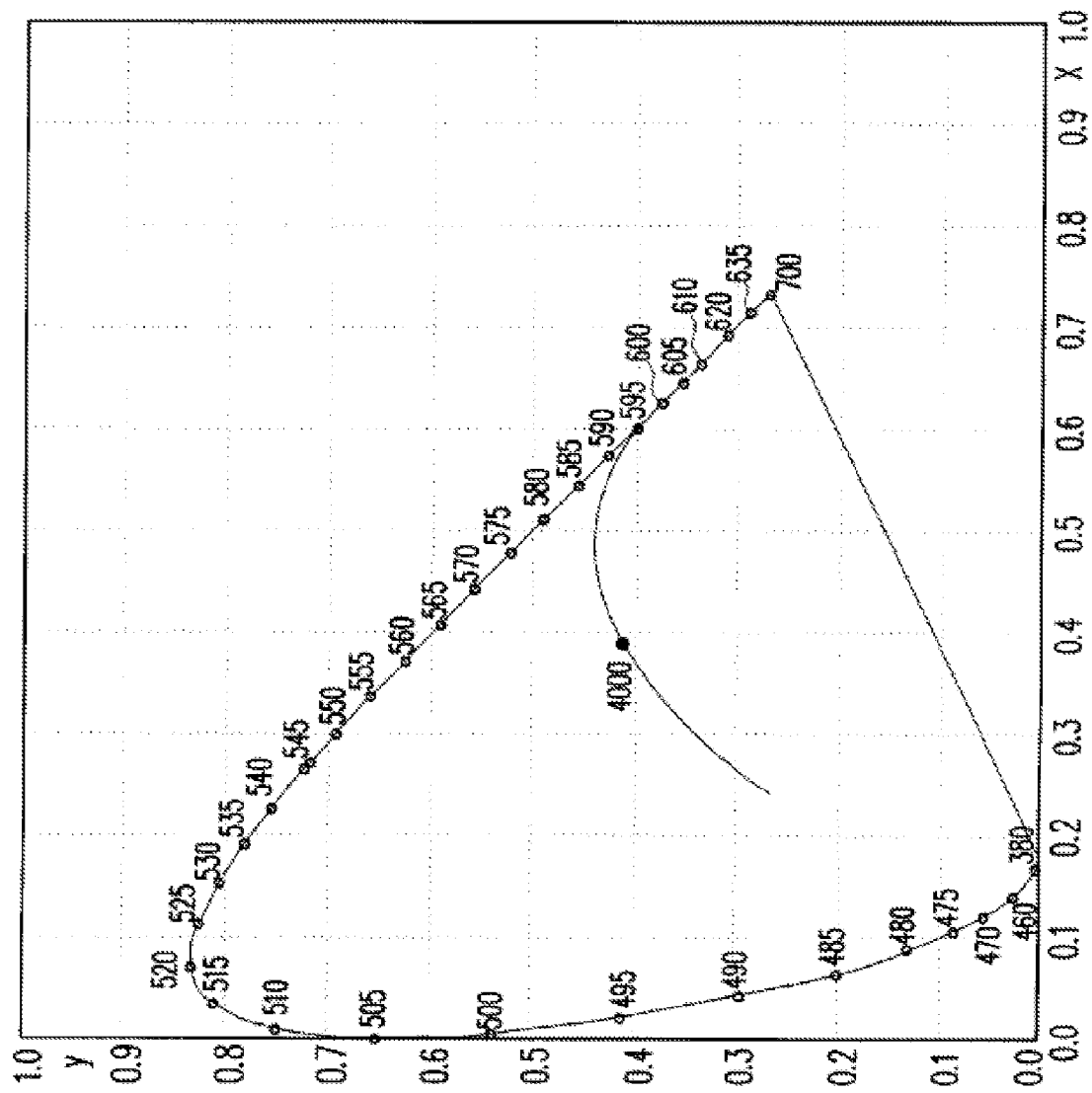

FIG. 5 schematically shows a color-temperature-tunable device 200 consistent with another embodiment of the present invention. Color-temperature-tunable device 200 comprises two groups of LED chips mounted on a substrate (not shown) and covered by a wavelength converting layer (not shown) comprising phosphor. Group I comprises LED chips 202-1 and 202-2 connected in series, and Group II comprises LED chips 204-1 and 204-2 connected in series. LED chips 202-1 and 202-2 may be gallium nitride based. LED chips capable of emitting blue lights having a peak wavelength in the range from about 450 nm to about 470 nm. LED chips 204-1 and 204-2 may be gallium nitride based LED chips capable of emitting blue lights having a peak wavelength in the range from about 400 nm to about 440 nm. Groups I and II may be individually driven by two power sources (not shown).

Table 1 shows the measurement results of various parameters for color-temperature-tunable device 200 under different combinations of driving currents. In Table 1, the driving currents for Group I and Group II are represented by $I_1$ and $I_2$, respectively. CIE-x and CIE-y are the chromaticity coordinates of the resultant white light in the CIE-1931 color space. IV and $P_{out}$ are the luminous flux and the output radiant power of the resulted white light, respectively. CCT is the correlated color temperature of the resulted white light. $P_{in}$ is the total electrical power inputted into the color-temperature-tunable device. LES is the luminous efficacy of the color-temperature-tunable device, which is the ratio of IV and $P_{in}$.

TABLE 1

| $I_1$ (mA) | $I_2$ (mA) | CIE-x | CIE-y | IV (lm) | $P_{out}$ (W) | CCT (K) | $P_{in}$ (W) | LES (lm/W) |
|---|---|---|---|---|---|---|---|---|
| 350 | 0 | 0.27 | 0.25 | 163.4 | 0.622 | 19585 | 2.28 | 71.68 |
| 300 | 50 | 0.27 | 0.26 | 162 | 0.597 | 13378 | 2.21 | 73.44 |
| 175 | 175 | 0.31 | 0.32 | 167.6 | 0.549 | 6746 | 2.15 | 78.05 |
| 100 | 250 | 0.34 | 0.38 | 166.2 | 0.503 | 5231 | 2.19 | 75.8 |
| 50 | 300 | 0.37 | 0.43 | 163.8 | 0.464 | 4510 | 2.25 | 72.73 |
| 0 | 350 | 0.42 | 0.51 | 154.7 | 0.404 | 3941 | 2.37 | 65.37 |

It is seen from Table 1 that with decreasing driving current for Group I and increasing driving current for Group II, that is, with decreasing driving current for the LED chips emitting light with longer peak wavelength and increasing driving current for the LED chips emitting light with shorter peak wavelength, the color temperature of the resultant white light decreases. However, the total luminous flux and the total input power are kept approximately constant. Therefore, color-temperature-tunable device 200 may emit white light having different color temperatures without significantly affecting the brightness of the emitted light and the total input power. Moreover, as explained above, although LED chips 204-1 and 204-2 emit blue light with shorter peak wavelength and may be spatially separated from LED chips 202-1 and 202-2, since human eyes are not sensitive to the blue light having a wavelength in the range of about 400 nm to about 440 nm, the white light emitted by color-temperature-tunable device 200 may not exhibit noticeable spatial non-uniformity.

FIGS. 6A, 7A, 8A, and 9A show exemplary spectra of the output light emitted by color-temperature-tunable device 200 under different combinations of driving currents. For FIGS. 6A, 7A, 8A, and 9A, the driving current for Group I is 300 mA, 175 mA, 100 mA, and 50 mA, respectively, and the driving current for Group II is 50 mA, 175 mA, 250 mA, and 300 mA, respectively. The color temperature of the resultant white light is about 13000 K, about 6700 K, about 5200 K, and about 4500 K, respectively. FIGS. 6B, 7B, 8B, and 9B show the position of the resultant white light in the CIE-1931 color space.

Figure 10:
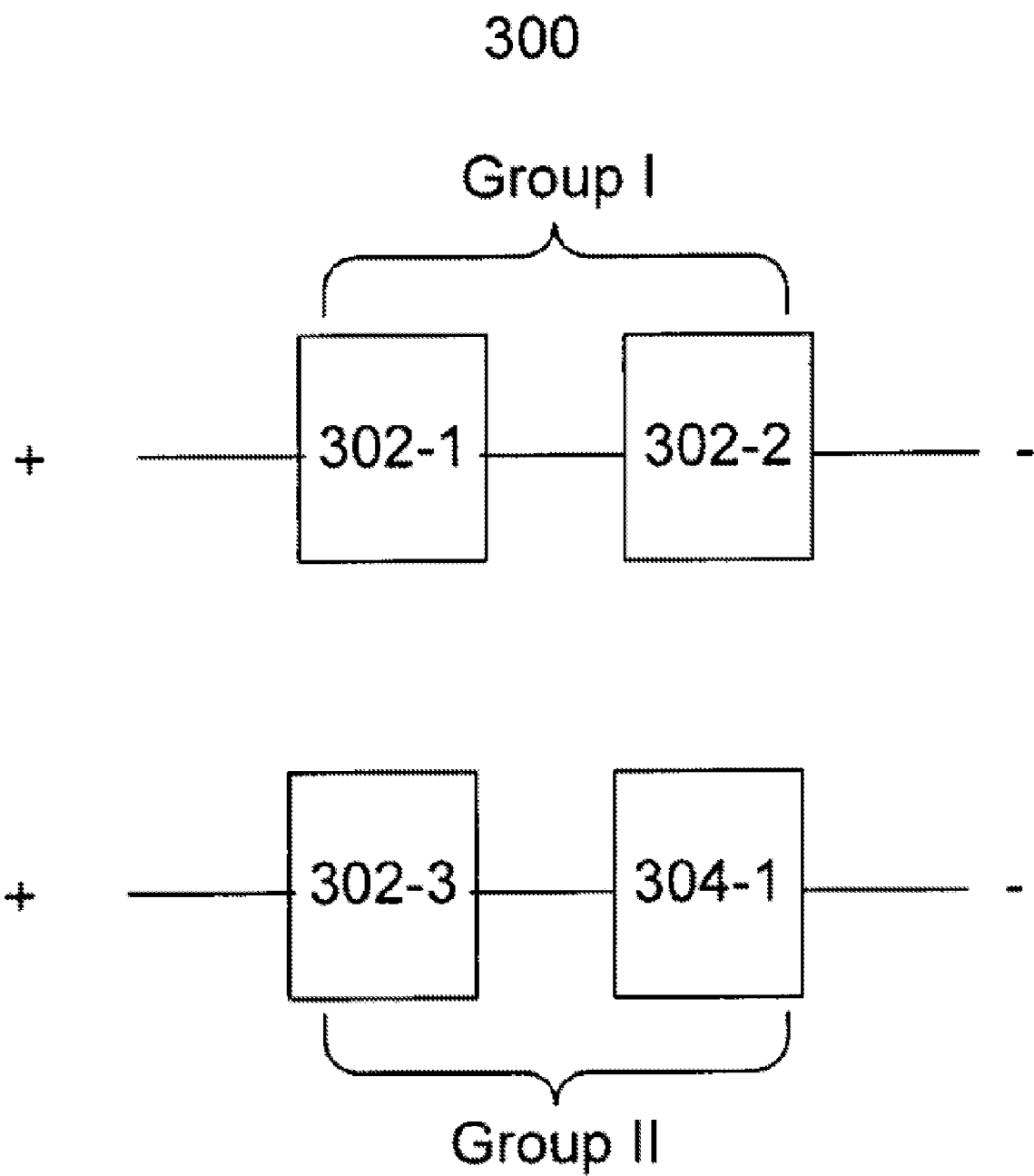
FIG. 10 schematically shows a color-temperature-tunable device consistent with yet another embodiment of the present invention.

FIG. 10 schematically shows a color-temperature-tunable device 300 consistent with yet another embodiment of the present invention. Color-temperature-tunable device 300 comprises two groups of LED chips mounted on a substrate (not shown) and covered by a wavelength converting layer (not shown) comprising phosphor. Group I comprises LED chips 302-1 and 302-2 connected in series, and Group II comprises LED chips 302-3 and 304-1 connected in series. LED chips 302-1, 302-2, and 302-3 may be gallium nitride based LED chips capable of emitting blue lights having a peak wavelength in the range from about 450 nm to about 470 nm. LED chip 304-1 may be a gallium nitride based LED chip capable of emitting blue light having a peak wavelength in the range from about 400 nm to about 440 nm. Groups I and II may be individually driven by two power sources (not shown). Table 2 shows the measurement results of various parameters for color-temperature-tunable device 300 under different combinations of driving currents.

TABLE 2

| $I_1$ (mA) | $I_2$ (mA) | CIE-x | CIE-y | IV (lm) | $P_{out}$ (W) | CCT (K) | $P_{in}$ (W) | LES (lm/W) |
| --- | --- | --- | --- | --- | --- | --- | --- | --- |
| 350 | 0 | 0.28 | 0.28 | 176.4 | 0.607 | 9781 | 2.28 | 77.42 |
| 300 | 50 | 0.29 | 0.29 | 178 | 0.61 | 9405 | 2.23 | 79.84 |
| 175 | 175 | 0.29 | 0.29 | 180.7 | 0.611 | 8737 | 2.16 | 83.59 |
| 100 | 250 | 0.3 | 0.31 | 180.6 | 0.598 | 7849 | 2.15 | 84.08 |
| 50 | 300 | 0.3 | 0.31 | 180.8 | 0.593 | 7539 | 2.16 | 83.79 |
| 0 | 350 | 0.31 | 0.34 | 173.7 | 0.544 | 6373 | 2.22 | 78.14 |

It is seen from Table 2 that, with decreasing driving current for Group I and increasing driving current for Group II, that is, with decreasing the total driving current for the LED chips emitting light with longer peak wavelength and increasing the driving current for the LED chip emitting light with shorter peak wavelength, the color temperature of the resultant white light decreases. However, the total luminous flux and the total input power are kept approximately constant. Therefore, color-temperature-tunable device 300 may emit white lights having different color temperatures without significantly affecting the brightness of the emitted lights and the total input power. Moreover, as explained in the above, although LED chip 304-1 emits a blue light with shorter peak wavelength and may be spatially separated from LED chips 302-1, 302-2, and 302-3, the white light emitted by color-temperature-tunable device 300 also may not exhibit noticeable spatial non-uniformity.

Consistent with the present invention, the wavelength converting layer used to convert the blue light emitted by the LED chips may be, for example, a single wavelength converting layer 120 shown in FIG. 1, above the LED chips in the color-temperature-tunable device. In some embodiments, the wavelength converting layer may comprise a plurality of layers, each of which covers at least a portion of at least one of the LED chips in the color-temperature-tunable device consistent with the present invention. For example, the wavelength converting layer may comprise a plurality of layers, each of which is above at least a portion of one LED chip in the color-temperature-tunable device consistent with the present invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of operating a color-temperature-tunable device, comprising:
   driving a first light emitting diode (LED) chip with a first driving current from a first power source, the first LED chip configured to emit a first light having a first peak wavelength;
   driving a second LED chip with a second driving current from a second power source, the second LED chip configured to emit a second light having a second peak wavelength; and
   maintaining a total driving current comprising the first driving current and the second driving current approximately constant,
   wherein the second peak wavelength is different from the first peak wavelength.

2. The method of claim 1, wherein the first driving current and the second driving current are different from one another.

3. The method of claim 1, further comprising:
   providing a wavelength converting layer above at least a portion of the first LED chip and at least a portion of the second LED chip.

4. The method of claim 3, wherein the wavelength converting layer comprises a phosphor material that is capable of emitting a yellow light under the excitation of a light having a wavelength shorter than the yellow light emitted by the phosphor material.

5. The method of claim 3, wherein the wavelength converting layer comprises a phosphor material, and wherein the phosphor material has different excitation efficiencies at the first peak wavelength and the second peak wavelength.

6. The method of claim 3, wherein the wavelength converting layer comprises a phosphor material, and wherein the phosphor material comprises YAG:Ce$^{3+}$.

7. The method of claim 3, wherein the wavelength converting layer comprises a single layer.

8. The method of claim 3, wherein the wavelength converting layer comprises a plurality of layers, and wherein each of the plurality of layers is above at least a portion of the first LED chip and at least a portion of the second LED chip.

9. The method of claim 1, wherein the first peak wavelength is within a range from approximately 450 nm to approximately 500 nm, and wherein the second peak wavelength is within a range from approximately 370 nm to approximately 440 nm.

10. The method of claim 1, wherein the first peak wavelength is within a range from approximately 450 nm to approximately 470 nm, and wherein the second peak wavelength is within a range from approximately 400 nm to approximately 440 nm.

11. The method of claim 1, wherein the first LED chip and the second LED chip comprise gallium nitride based LED chips made of gallium nitride based materials.

12. The method of claim 1, wherein the first LED chip comprises a first blue LED chip, and wherein the second LED chip comprises a second blue LED chip.

13. The method of claim 12, wherein:
   driving a first LED chip comprises driving multiple first blue LED chips that are configured to emit light having the first peak wavelength, multiple first blue LED chips being driven by the first driving current; and
   driving a second LED chip comprises driving multiple second blue LED chips that are configured to emit light having the second peak wavelength, the multiple second blue LED chips being driven by the second driving current.

* * * * *